United States Patent
Naito et al.

(10) Patent No.: US 7,098,532 B2
(45) Date of Patent: Aug. 29, 2006

(54) CERAMIC PACKAGE AND CHIP RESISTOR, AND METHODS FOR PRODUCTION OF THE SAME

(75) Inventors: Junya Naito, Uozu (JP); Fumio Ishita, Namerikawa (JP); Atsushi Shibata, Uozu (JP); Noboru Yamagata, Tokyo (JP)

(73) Assignee: Nippon Carbide Kogyo Kabushiki Kaisha, (JP)

( * ) Notice: Subject to any disclaimer, the term of this patent is extended or adjusted under 35 U.S.C. 154(b) by 197 days.

(21) Appl. No.: 10/502,289

(22) PCT Filed: Nov. 19, 2003

(86) PCT No.: PCT/JP03/14753

§ 371 (c)(1),
(2), (4) Date: Jul. 22, 2004

(87) PCT Pub. No.: WO2004/049356

PCT Pub. Date: Jun. 10, 2004

(65) Prior Publication Data

US 2005/0082648 A1    Apr. 21, 2005

(30) Foreign Application Priority Data

Nov. 25, 2002    (JP) .............................. 2002-341300

(51) Int. Cl.
*H01L 23/12* (2006.01)
*H01L 23/053* (2006.01)
(52) U.S. Cl. ............... 257/700; 257/703; 438/125
(58) Field of Classification Search ............. 257/700, 257/703, 705; 438/125, 127

See application file for complete search history.

(56) References Cited

U.S. PATENT DOCUMENTS 5,644,163 A * 7/1997 Tsuji ..................... 257/706
5,822,851 A * 10/1998 Yamasaki et al. ........... 29/846

FOREIGN PATENT DOCUMENTS

JP    07-221454 A1    8/1995

(Continued)

OTHER PUBLICATIONS

International Search Report for PCT/JP03/14753 mailed on Mar. 9, 2004.

*Primary Examiner*—Phat X. Cao
*Assistant Examiner*—Theresa T. Doan
(74) *Attorney, Agent, or Firm*—Rader, Fishman & Grauer PLLC

(57) ABSTRACT

A ceramic package and a chip resistor obtained by forming, on a plastic ceramic green sheet comprising 100 parts by weight of a ceramic powder mainly composed of borosilicate glass, into which 10 to 30 parts by weight of an acrylic copolymer obtained by polymerizing 100 parts by weight of a (meth)acrylic acid ester and 1 to 10 parts by weight of a monomer having a functional group of a hydroxyl group, acid amide group, or amino group and having a Tg in the range of −30° C. to +10° C. is compounded, a conductor layer using a plastic conductive paste obtained by compounding, into 100 parts by weight of a conductive powder, 5 to 20 parts a mixture of an acrylic copolymer having a Tg of not more than −30° C. and an ethylcellulose-based binder, press forming the resultant single layer of ceramic green sheet, and calcining the resultant ceramic green sheet having the integrally formed bottom, opening and opening circumferential edge and a method for producing the same.

11 Claims, 5 Drawing Sheets

FOREIGN PATENT DOCUMENTS

| | | |
|---|---|---|
| JP | 2000-040878 A1 | 2/2000 |
| JP | 2001-002475 A1 | 1/2001 |
| JP | 2001-144227 A1 | 5/2001 |
| JP | 2001-181023 A1 | 7/2001 |

* cited by examiner

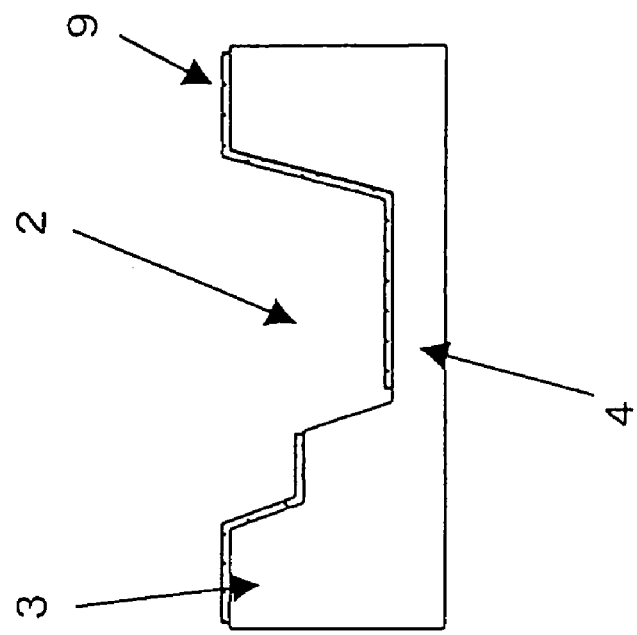
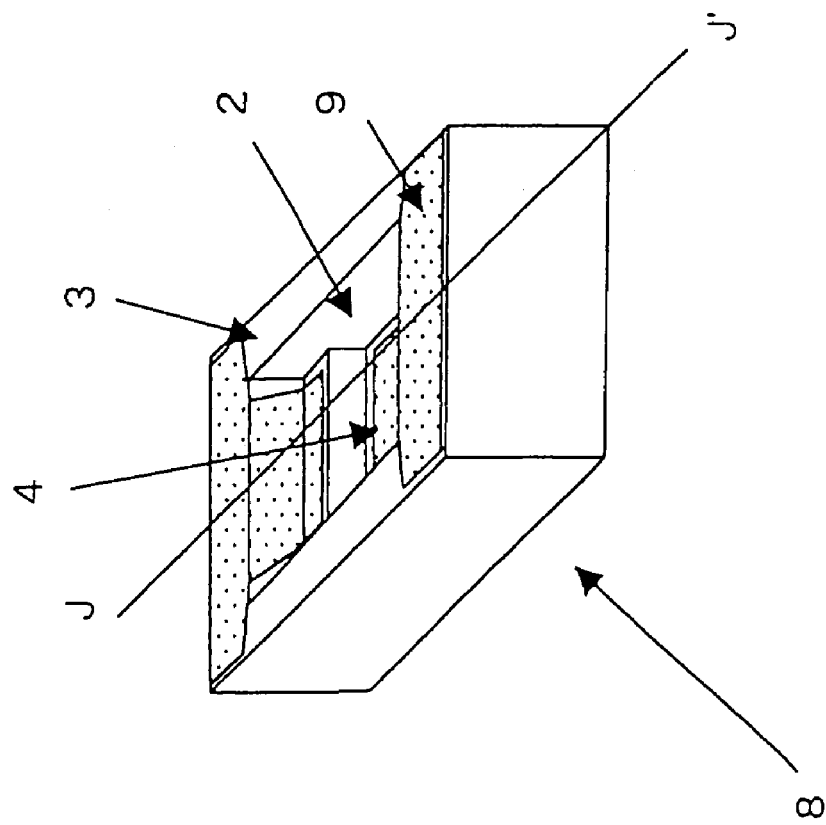
Fig.1(a)
Fig.1(b)

CERAMIC PACKAGE AND CHIP RESISTOR, AND METHODS FOR PRODUCTION OF THE SAME

TECHNICAL FIELD

The present invention relates to a ceramic package for storing a device for an electronic component, a chip-type resistor and methods for the production of the same.

BACKGROUND ART

A ceramic package for storing a device for an electronic component formed with a bottom, an opening, and an opening circumferential edge has been proposed and put into use. As a typical method for production of a conventional ceramic package, the method of pressing a ceramic powder composed of a powder of a ceramic, to which a binder has been added, in a mold having a desired shape, sintering the press formed body, then forming a conductor layer after the sintering is known (for example, see Japanese Unexamined Patent Publication (Kokai) No. 2001-181023). As another conventional method of production of a ceramic package, a lamination method of pressing and heating a plurality of ceramic green sheets formed with holes, printed on, and formed with conductor layers so as to laminate them and then sintering the laminate is known (for example, see Japanese Unexamined Patent Publication (Kokai) No. 7-221454). On the other hand, a chip resistor comprises a ceramic substrate having two flat surfaces at the two ends, of which external electrodes are arranged, a resistor formed so as to bridge the electrodes and a protector covering the same. These are formed by printing and calcining.

However, production of ceramic packages by the powder pressing method of the prior art requires that the ceramic packages be individually pressed one by one by a press and be sintered together with the ceramic powder and that the ceramic powder adhering to the ceramic packages be removed. Recently, when production of ceramic packages having a size of 4 mm square or less is required, there has been the problem that the work efficiency has been extremely poor and the cost becomes high. Further, the formation of a conductor layer on a package with step differences has the problem of requiring individual packages to be processed, and therefore, the work efficiency is an extremely poor. Note that, in the powder pressing method of the prior art as well, sometimes a large number of packages are handled, but due to the brittleness, when handling thin sheets, a sheet size of about 1 inch square is the limit and the work efficiency is poor. The lamination method of the prior art laminates sheets, and therefore, the work efficiency would appear, at first glance, to be good, but since it is necessary to punch holes in, print on, and form conductor layers on the individual green sheets and laminate a plurality of the ceramic green sheets at, for example, 150° C. for about 120 minutes by a vacuum lamination system, there is the problem that the work efficiency is extremely poor and the cost is high. Further, the ceramic green sheets using conventional binders have elasticity and lack plasticity, and therefore it was not possible to form relief shapes into the desired shapes by a press at all times.

Further, the chip resistor produced by the conventional method ended up with a raised surface due to the formation of the external electrodes at the two ends and the resistor and protector, and therefore, there is the problem that flatness is lost and inconveniences easily occur at the time of mounting.

Further, the conventional method for producing a chip resistor has the problem that the step of forming the external electrodes at the two ends is troublesome and the cost is accordingly increased it.

SUMMARY OF INVENTION

Accordingly, the objects of the present invention are to solve the problems in the work efficiency of the production of the above conventional ceramic packages and chip resistors, the problem of the higher cost accompanying this, etc.

In accordance with the present invention, there is provided a ceramic package having a bottom, an opening and an opening circumferential edge formed by integral molding, wherein the ceramic package obtained by forming, on a plastic ceramic green sheet comprising (A) 100 parts by weight of a ceramic powder mainly composed of borosilicate glass, into which (B) 10 to 30 parts by weight, preferably 15 to 25 parts by weight, of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg in the range of more than −30° C. to not more than +10° C., preferably −20° C. to 0° C., is compounded, a conductor layer using a plastic conductive paste obtained by compounding, into 100 parts by weight of a conductive powder, 5 to 20 parts by weight of (C) a mixture of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg of not more than −30° C. and an ethylcellulose-based binder, press forming the resultant single layer of the ceramic green sheet having the conductor layer formed above to provide the bottom, opening and opening circumferential edge, and calcining the integrally press formed ceramic green sheet.

In accordance with the present invention, there is also provided a method for producing a ceramic package having a bottom, an opening and an opening circumferential edge formed by integral molding comprising the steps of:

forming, on a plastic ceramic green sheet comprising (A) 100 parts by weight of a ceramic powder mainly composed of borosilicate glass, into which (B) 10 to 30 parts by weight, preferably 15 to 25 parts by weight, of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg in the range of more than −30° C. to not more than +10° C., preferably −20° C. to 0° C., is compounded, a conductor layer using a plastic conductive paste (C) obtained by compounding, into 100 parts by weight of a conductive powder, 5 to 20 parts by weight of (C) a mixture of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg of not more than −30° C,. and an ethylcellulose-based binder;

press forming the resultant single layer of ceramic green sheet having the conductor layer formed above to form a bottom, opening and opening circumferential edge, and calcining the press formed ceramic green sheet.

In accordance with the present invention, there is further provided a chip resistor obtained by calcining a ceramic green sheet having a bottom, an opening and an opening circumferential edge formed by integral molding, by forming on a plastic ceramic green sheet comprising (A) 100 parts by weight of a ceramic powder mainly composed of borosilicate glass, into which (B) 10 to 30 parts by weight of an acrylic copolymer obtained by polymerizing 100 parts by weight of at least one monomer selected from (meth) acrylic acid esters and 1 to 10 parts by weight of a monomer having a functional group of a hydroxyl group, acid amide group or amino group and having a Tg in the range of more than −30° C. to not more than +10° C., preferably −20° C. to 0° C., is compounded, a conductor layer using a plastic conductive paste obtained by compounding, into 100 parts by weight of a conductive powder, 5 to 20 parts by weight of (C) a mixture of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg of not more than −30° C. and an ethylcellulose-based binder, further forming, on the resultant single layer of the ceramic green sheet formed having the conductor layer thus obtained, a resistor and protector, followed by press forming to form a bottom, opening and opening circumferential edge, and calcining the integrally press formed ceramic green sheet.

In accordance with the present invention, there is still further provided a method for producing a chip resistor obtained from a ceramic green sheet having a bottom, an opening and an opening circumferential edge formed by integral molding comprising the steps of:

forming on a plastic ceramic green sheet comprising (A) 100 parts by weight of a ceramic powder mainly composed of borosilicate glass, into which (B) 10 to 30 parts by weight of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg in the range of more than −30° C. to not more than +10° C., preferably −20° C. to 0° C., is compounded, a conductor layer using a plastic conductive paste obtained by compounding, into 100 parts by weight of a conductive powder, 5 to 20 parts by weight of (C) a mixture of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg of not more than −30° C. and an ethylcellulose-based binder;

forming, on the resultant single layer of ceramic green sheet formed having the conductor layer a resistor and protector, followed by press forming to form a bottom, opening and opening circumferential edge; and calcining the integrally press formed ceramic green sheet.

BRIEF DESCRIPTION OF DRAWINGS

FIG. 1 is (a) a perspective view of a ceramic package unit showing an embodiment of the production method of a ceramic package according to the present invention and (b) a cross-sectional view along the line J–J' of the same.

BEST MODE FOR CARRYING OUT THE INVENTION

Figure 2:
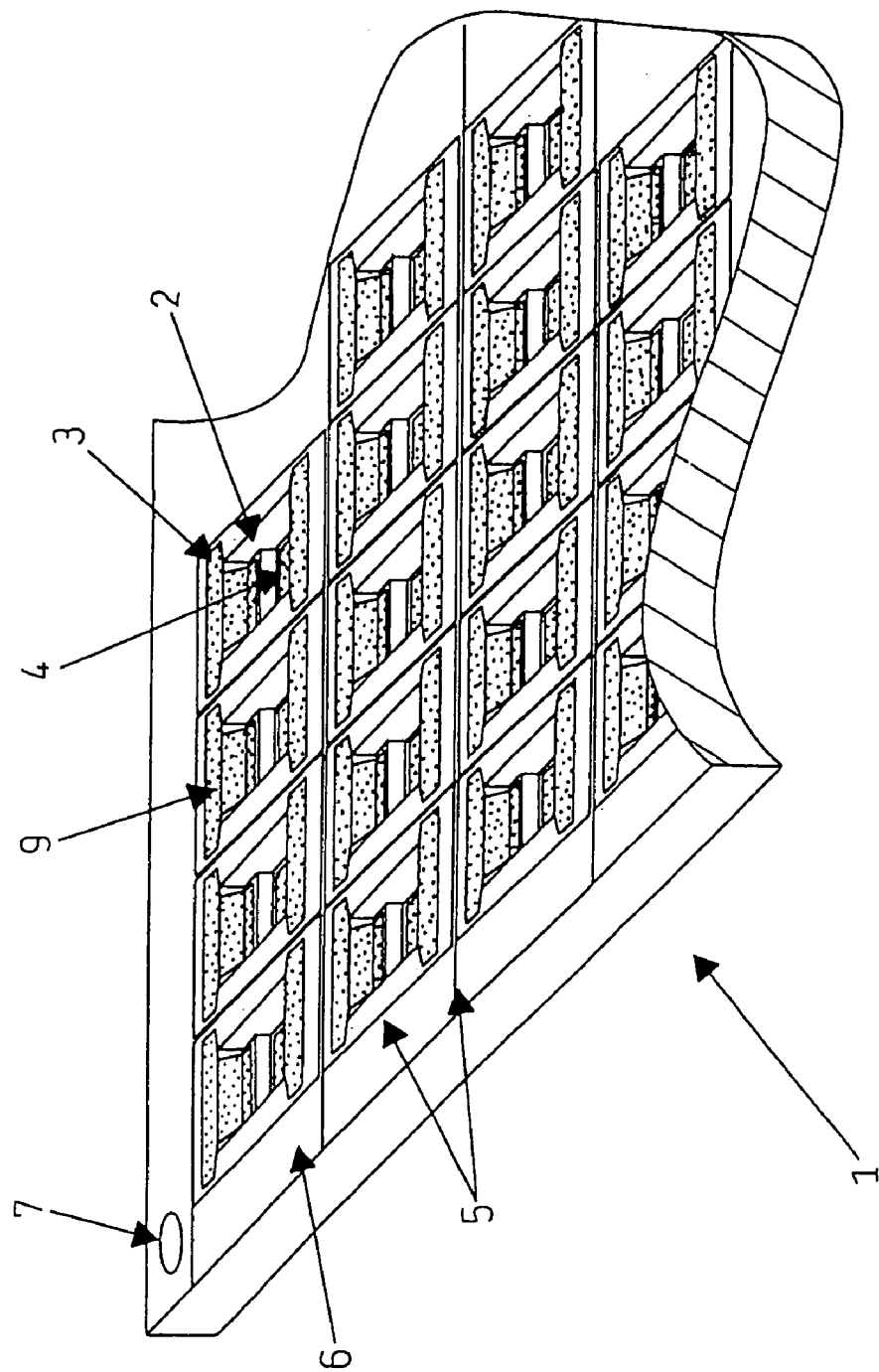
FIG. 2 is a perspective view of a ceramic package sheet (i.e., press formed ceramic green sheet) according to another embodiment of the production method of a ceramic package according to the present invention.

The present inventors engaged in studies to solve the above problems and, as a result, found that (i) by using, for the binder of the ceramic green sheet, an acrylic copolymer mainly composed of an ethyl acrylate/methyl methacrylate copolymer, a plastic ceramic green sheet free from return deformation even if pressed in a mold can be obtained, (ii) by using, for the binder of the conductive paste, a binder mainly composed of an acrylic copolymer such as a butyl acrylate/2-hydroxyethyl methacrylate and a cellulose derivative, a plastic conductive paste free from return deformation even if pressed in a mold, superior in print suitability, and enabling formation of a conductor layer having good mold release can be obtained, (iii) due to this, by pressing a single layer of green sheet, it is possible to integrally form a bottom, opening and opening circumferential edge and, by calcining this, possible to obtain a ceramic package having good mass producibility and work efficiency and reduced cost, whereby the present invention has been completed.

To solve the above problems, it is possible to form a recess in an insulating substrate for a chip resistor, arrange a resistor and a protector inside it, and eliminate side surface exposure of the external electrodes so as to obtain a thin chip resistor having a good flatness. Further, by changing the mounting to a type forming bump electrodes on top, flipping the chip, then mounting, it is possible to eliminate the step of forming the external electrodes and streamline other steps. Further, since the patterns are laid on a plane, the electrical properties which become a problem after mounting, in particular the impedance characteristics, are improved.

First, explaining the ceramic package according to the present invention, the "ceramic package" in the present invention is a container for storing an individual electronic component, etc. or a ceramic cell unit, etc. comprising cells for holding a plurality of electronic components etc. Below, the ceramic package according to the present invention and a production method of the same will be described in detail, while referring to FIGS. 1 to 3, but the present invention is by no means limited to the following description.

The ceramic package according to the present invention is composed of a ceramic, but the ceramic material is not particularly limited. As ceramic materials, glass ceramic, alumina, mullite, aluminum nitride, etc. may be exemplified. Preferably, the package is composed of a glass ceramic, which is a low temperature firing ceramic material. More preferably, the glass ceramic material is a ceramic powder mainly composed of borosilicate glass containing 50 to 70% by weight borosilicate glass, 30 to 50% by weight of filler, and/or 0 to 5% by weight of an additive.

The borosilicate glass used in the present invention is composed of a borosilicate type glass etc. and is a material known in the past. The filler usable in the present invention may be, for example, alumina, mullite, cordierite, fosterite, quartz, etc. and adjusts the strength, coefficient of heat expansion, dielectric constant, etc. of the ceramic. Further, the additive usable in the present invention is preferably an oxide of an alkali metal such as sodium or potassium and adjusts the softening temperature of the ceramic. In the present invention, these borosilicate glass, filler, and additive are weighed, pulverized, and mixed to obtain a ceramic powder mainly composed of borosilicate glass.

The production method of the ceramic green sheet may comprise weighing the ceramic powder and acrylic binder, kneading them together, and forming a sheet by an ordinary method. The acrylic binder usable for production of the plastic ceramic green sheet of the present invention is a copolymer composed of at least one monomer selected from methyl acrylate, ethyl acrylate, butyl acrylate, 2-ethylhexyl acrylate, i-octyl acrylate, methyl methacrylate, ethyl methacrylate, n-butyl methacrylate, i-butyl methacrylate, 2-ethylhexyl methacrylate, lauryl methacrylate, etc. and a functional group monomer having a hydroxyl group, acid amide group or amino group (for example, 2-hydroxyethyl methacrylate, 2-hydroxyethyl acrylate, acrylamide and diethylaminoethyl methacrylate). It is possible to use a binder generally used in the past.

A particularly preferable acrylic binder is a copolymer composed of ethyl acrylate or ethyl acrylate and methyl acrylate plus a functional group monomer having a hydroxyl group, acid amide group or amino group (preferably 2-hydroxyethyl methacrylate, 2-hydroxyethyl acrylate, acrylamide and diethylaminoethyl methacrylate). When ethyl acrylate and methyl methacrylate are used, the copolymer ratio is less than 30 parts by weight of methyl methacrylate, based upon 100 parts by weight of ethyl acrylate. This is because, if the ratio of the methyl methacrylate to the ethyl acrylate is too large, the followability (i.e., press formability) of the green sheet to the relief shapes of the mold will become poor.

Further, according to the present invention, by copolymerization with a functional group monomer having a hydroxyl group, acid amide group or amino group, it is possible to improve the dispersibility of the ceramic powder (in particular borosilicate glass). The ratio of blending of these functional group monomers is 1 to 10 parts by weight, more preferably 1 to 5 parts by weight, based upon 100 parts by weight of ethyl acrylate or ethyl acrylate and methyl methacrylate or another acrylic binder monomer.

The preferable weight average molecular weight (MW) of the acrylic binder polymer usable in the production of a ceramic green sheet in the present invention is, as measured by GPC (polystyrene conversion), 100,000 to 800,000, particularly preferably 300,000 to 500,000. If the molecular weight is too low, the shape retentionability is poor and cracks easily occur at the time of press forming. Contrary to this, if the molecular weight is too high, elastic deformation easily occurs at the time of press forming and the desired shape is liable to become difficult to obtain.

The amount of addition of the acrylic binder is not particularly limited, but may be 10 to 30 parts by weight with respect to 100 parts by weight of the ceramic powder. 15 to 20 parts by weight is more preferable. If the amount added is too small, the press formability is liable to become poor, while if too great, the removability of the binder is liable to become poor and loss of shape to occur at the time of firing.

According to the present invention, it is preferable to further add a plasticizer to the ceramic powder and acrylic binder. As such a plasticizer, for example, a phthalic acid ester, adipic acid ester, polyester based plasticizer, etc. may be mentioned. From the compatibility with an acrylic binder, a phthalic acid ester or adipic acid ester is preferably used. Particularly, dibutyl phthalate (DBP), dioctyl phthalate (DOP), dioctyl adipate (DOA), etc. may be exemplified, but the plasticizers which can be used in the present invention are not limited thereto.

The amount added in the case where this plasticizer is used is also not limited, but not more than 10 parts by weight based upon 100 parts by weight of the ceramic powder is preferable. This is because if the amount is more than 10 parts by weight, the strength of the green sheet is decreased and the retention of the shape after molding becomes difficult in terms of work.

In the present invention, in addition to the ceramic powder, acrylic binder, and plasticizer, a solvent, dispersant, deflocculant, wetting agent, defoaming agent, or other general additive may be used.

To produce a ceramic package according to the present invention, the ceramic powder and acrylic binder and further the plasticizer, solvent, etc. are weighed and are pulverized, mixed, and dispersed by a ball mill to form a slurry. Preferably, the ingredients are weighed and then pulverized, mixed, and dispersed with half of the amount of the acrylic binder, then the remaining amount is added and the resultant mixture is pulverized, mixed, and dispersed. By doing this, the homogeneity is increased, and therefore, this is preferred. The method of forming this slurry into a sheet may be any method usually used and is not particularly limited. For example, it is possible to use the doctor blade method to coat the slurry on a PET film in a planar shape and dry it by hot air so as to prepare a ceramic green sheet which has pliability, is soft, and is easy to handle.

The plastic conductive paste usable in the present invention includes a conductive powder and a binder and preferably glass powder. As the conductive powder, Ag powder, Ag—Pd powder, Ag—Pt powder, Au powder, Au—Pd powder, Au—Pt powder, Ni powder, Cu powder, Mo—Mn powder, w powder, conductive oxide powder, etc. may be used. These are also materials generally used in the past. These powders are preferably those which can be calcined at 700 to 1050° C. such as Ag powder, Ag—Pd powder, Ag—Pt powder, Cu powder, Au powder, Au—Pd powder, Au—Pt powder, Ni powder, etc. More preferably, they are relatively inexpensive these often used in thin film printing technology such as Ag powder, Ag—Pd powder, and Ag—Pt powder.

The binder to be blended into the conductive paste usable in the present invention is an acrylic copolymer of 100 parts by weight of a (meth)acrylic acid ester and 1 to 10 parts by weight, preferably 3 to 8 parts by weight, of a monomer having a functional group of a hydroxyl group, acid amide group, or amino group. If the amount of the latter monomer in the copolymer is too small, the dispersibility of the conductive powder is poor and a uniform conductor layer cannot be obtained after calcining, and therefore, this is not preferred. Conversely, if the amount is too large, the plasticity is impaired, and therefore this is again not preferable.

As the monomer usable in the acrylic copolymer, at least one monomer selected from monomers such as acrylic acid esters (for example, ethyl acrylate, butyl acrylate, 2-ethylhexyl acrylate, and isooctyl acrylate) and methacrylic acid esters (for example, methyl methacrylate, ethyl methacrylate, 2-ethylhexyl methacrylate, and lauryl methacrylate) may be used to produce the copolymer.

An acrylic binder particularly preferable for use for production of a conductive paste in the present invention is a copolymer of butyl acrylate and 2-hydroxyethyl methacrylate which offers good followability in shaping by a mold, freedom from broken conductors, and a good balance of cohesiveness. The copolymer ratio of the butyl acrylate and 2-hydroxyethyl methacrylate is preferably 1 to 10 parts by weight of 2-hydroxyethyl methacrylate, preferably 3 to 8 parts by weight, based upon 100 parts by weight of the butyl acrylate. If the ratio of the 2-hydroxyethyl methacrylate based upon the butyl acrylate is too large, the deformation (or elongation) at the time of press forming becomes poor which is liable to cause conductor breaks. Contrary to this, if the amount is too small, the dispersability with the conductive powder becomes poor and a uniform conductor layer is liable to become difficult to obtain.

The weight average molecular weight (MW) of the acrylic binder polymer usable for production of the plastic conductive paste according to the present invention is preferably, in terms of GPC (polystyrene conversion) 200,000 to 800,000. If the molecular weight is too low, the holdability of the metal conductive powder becomes poor and immobilization on the green sheet is liable to become impossible. Contrary to this, if the amount is too high, elastic deformation is liable to follow at the time of calcining and predetermined conductor patterns are liable to become unable to be held.

As the ethyl cellulose usable for an ethyl cellulose based binder used blended with said acrylic binder for production of the conductive paste of the present invention, for example, Acrylon made by Hercules is suitable. Further, this may also be replaced with a commercially available conductive paste such as SP0302 made by DMC Square Japan, DD-1411A made by Kyoto Elex, etc.

The glass powder compounded into the conductive paste usable in a preferred embodiment of the present invention is a crystallized glass called "frit glass", borosilicate, or other low melting point glass and is used for bonding the electroconductor parts (or the conductor parts) to the ceramic substrate. The amount of the glass powder blended is not particularly limited, but preferably is 1 to 10 parts by weight based upon 100 parts by weight of the conductive powder.

The method of forming the conductor layer according to the present invention is not particularly limited, but for example, it is possible to coat the surface of a ceramic green sheet with a conductive paste made of conductive powder rendered into a paste form so as to form a desired electrode pattern. As the method of coating, it is possible to use any method known in the past such as thick film printing for coating a conductive paste by screen printing.

The conductive paste according to the present invention is coated and dried by a thick film printing technique by, for example, the screen printing method, deforms following the mold and is pressed and then fired together with the ceramic green sheet at a temperature of preferably 700° C. to 1050° C., more preferably 750° C. to 950° C. It shrinks along with the shrinkage of the sheet due to the firing to form a conductor layer with a good conductivity and good bonding and adhesion.

The press forming according to the present invention may be performed using a hard mold, a plastic mold, etc. The material and type of the mold are not limited. For example, a mold having a plurality of regularly arranged projections, a mold having a plurality of regularly arranged inverted V-shaped edges (i.e., knife shaped edges for forming break grooves), a mold formed with a plurality of projections and inverted V-shaped edges on a single mold, a system press forming break grooves by an NC cutting machine, etc. may be used. Note that the break grooves can also be formed not by press forming, but by, for example, dicing after calcining.

The press forming according to the present invention may be press forming one time or more times by a single mold, two molds, or more molds depending upon the size of the product and mold technology. For example, it is possible to heat a mold formed having a large number of projections for forming openings, heat the ceramic green sheet, transfer the projection patterns of the mold to the ceramic green sheet by pressing, then cool the mold and the ceramic green sheet after pressing.

The above preferred plastic ceramic green sheet including the acrylic binder and plasticizer can maintain the press transferred bottoms, openings and opening circumferential edges accurately. Further, the conductor layer can be formed, without cutting, at the bottom and/or opening circumferential edges and/or step difference forming parts of the bottoms and opening circumferential edges, while maintaining its conductivity.

Regarding the ceramic green sheet, on which the conductor layer, is formed by these methods, it is possible to form this ceramic green sheet by molding the ceramic green sheet in a mold to form bottoms, openings and opening circumferential edges and then forming a conductor layer at the bottoms and/or opening circumferential edges and/or the side faces of the parts formed with step differences at the bottoms and opening circumferential edges.

The ceramic green sheet for forming the conductor layer press formed in this way is calcined to produce a ceramic package. For example, in the case of a glass ceramic, it is preferable to calcine the sheet in the air atmosphere (in the air atmosphere, in the case where the conductor layer of Ag, Au, etc., while in a nitrogen atmosphere in the case of Cu, Ni, etc.) at a temperature of 700° C. to 1050° C. It is more preferable to calcine it at a temperature of 750° C. to 950° C.

The ceramic package thus produced is handled in a sheet state having pliability. The plastic ceramic green sheet is press formed, and therefore, it is possible to obtain a large number of ceramic package units. Mass producibility and work efficiency are good and the cost can be reduced. The ceramic package unit according to the present invention can be used as a container for electronic component devices storing electronic components. Further, the ceramic package unit storing electronic components etc. is useful as a leadless surface mounted electronic component device. Further, the ceramic cell sheet formed by ceramic cell units composed of a plurality of cells for storing a gas is also useful as a panel having gas sealed cells of a plasma display.

Next, when the chip resistor according to the present invention is explained, the "chip resistor" in the present invention means a device obtained by arranging bottom electrodes at the left and right on an insulating substrate having a recess in the surface thereof, arranging a resistor in the recess, covering the resistor by a protector, forming top electrodes on the bottom electrodes, and flipping this over for mounting.

Figure 4:
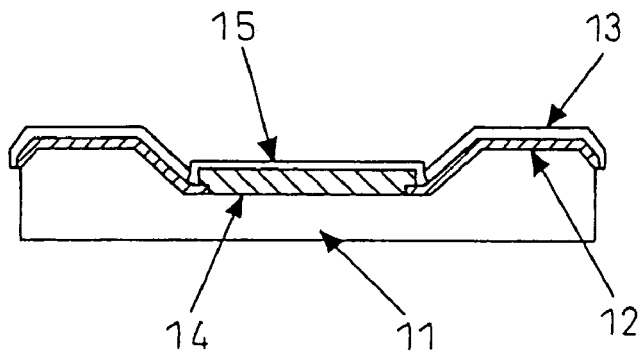
FIG. 4 is a cross-sectional explanatory view of an embodiment of a chip resistor according to the present invention.
Figure 5:
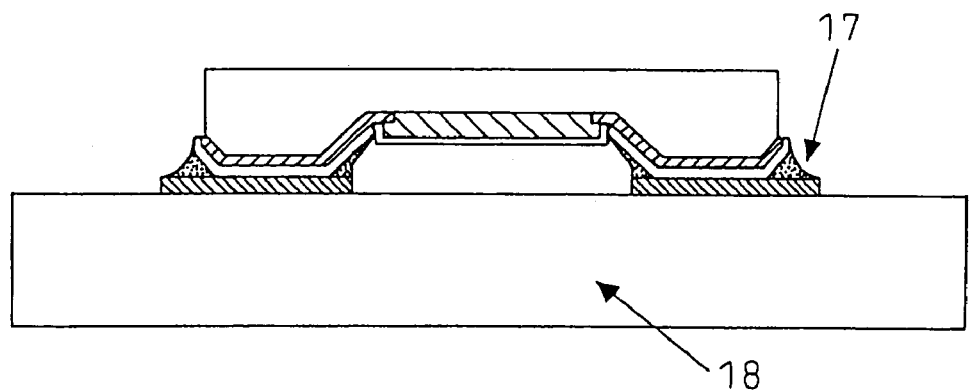
FIG. 5 is a view for explaining the state of soldering when mounting a chip resistor according to the present invention on a printed circuit board, etc.
Figure 6:
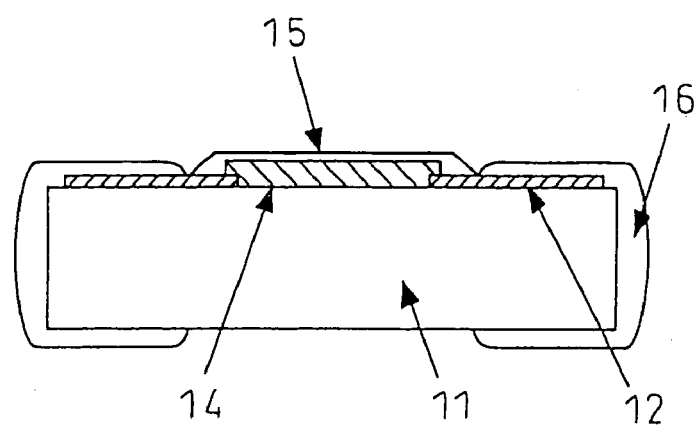
FIG. 6 is a cross-sectional explanatory view of an example of the structure of a conventional chip resistor.

As shown in FIG. 4, as the insulating substrate 11 of the chip resistor according to the present invention, the material does not have to be particularly limited to the alumina ceramic substrates being used for conventional chip resistors. Glass ceramic, alumina, mullite, aluminum nitride, silicon carbide, glass epoxy, and the like may also be used. It is preferable to use a glass ceramic type of ceramic material capable of cintering at a low temperature.

The electrode materials 12 and 13 are not limited to metal electrodes similar to conventional chip resistors. A metal such as Ag, Ag/Pd, Ag/Pt, Au, Au/Pt, Ni, Cu, Mo/Mn, W, conductive oxides such as ITO, ATO may also be used. Preferably, it is Ag, Ag/Pd, Cu, Au, Ni, etc. capable of calcining at 700° C. to 1050° C.

The resistor 14 is not limited to $RuO_2$ being used as conventional chip resistors. Resin-based resistance members such as a carbon resistor can also be used.

The protector 15 is not limited to an overcoat glass similar to that of a conventional chip resistor. Resin-based protective members such as an epoxy coating can also be used.

EXAMPLES

Examples of the production method of the ceramic package and chip resistor according to the present invention will be explained below, but the present invention is by no means limited to the following Examples.

Example 1

(1) Production of Plastic Ceramic Green Sheet Slurry

As the ceramic powder, 100 parts by weight of alumina filler-containing borosilicate glass (made by Nihon Yamamura Glass: BS-003; alumina to borosilicate glass (weight ratio)=50:50), 20 parts by weight of an ethyl acrylate/methyl methacrylate/2-hydroxyethyl methacrylate copolymer (weight ratio: 85/12/3, Tg=−15° C., weight average molecular weight (MW) converted to polystyrene 500,000) as an acryl binder, 4 parts by weight of di(2-ethylhexyl) phthalate and 1 part by weight of a butylbenzyl phthalate as plasticizers, and 55 parts by weight of a solvent (toluene/methylisobutylketone/n-butanol=1/1/1 (weight ratio)) were mixed by a dispersion mixer so as to obtain a ceramic green sheet slurry having a viscosity of 18,000 cps.

(2) Production of Plastic Ceramic Green Sheet

The above ceramic green sheet slurry was coated on a support film (weight 400 mm, length 100 m, thickness 100 μm) composed of polyethylene terephthalate (PET) treated for mold release using a comma roll coater. The coating thus formed was dried at 60 to 80° C. for 1 hour to remove the solvent. Due to this, a plastic green sheet having a thickness of 700 μm was produced.

(3) Preparation of Plastic Conductive Paste

As the conductive powder, 100 parts by weight of Ag powder (made by Daiken Chemical, S-202; average particle size 3.1 μm), 15 parts by weight of a butyl acrylate/2-hydroxyethyl methacrylate copolymer (weight ratio: 100/3) as a binder resin, and 30 parts by weight of a dilution solvent (ethylene glycol monoethyl ether/α-terpineol=1/1 (weight ratio)) were mixed in a dispersion mixer to obtain an acryl conductive paste master. The commercially available conductor paste (made by Kyoto Elex: DD-1411A-508) was added with the above acryl conductive paste master to obtain a weight ratio of 1:1 and the resultant mixture was mixed by a triple roll to obtain a plastic conductive paste.

(4) Shaping and Hole Punching in Plastic Ceramic Green Sheet

The plastic green sheet was cut to 18 cm×16 cm for each support film by a cutter and adhered to a hole-punching stainless steel sheet frame by tape. The frame was set in a hole punching machine and punched with printing positioning holes, printing fastening reference holes and press reference pin holes.

(5) Printing of Plastic Conductive Paste

The plastic ceramic green sheet shaped and punched in the above (4) was fixed to the stage of the screen printing machine by the reference holes, the plastic conductive paste prepared in the above (3) was positioned, then the sheet was printed at the prescribed positions. Next, the sheet was dried at 80° C. for 5 minutes so as to remove the solvent in the paste and form a plastic conductor layer of a thickness of 15 μm on the plastic ceramic green sheet.

(6) Press Forming by Mold

The shaping mold was composed of a superhard material. The cavity mold formed with a plurality of convex projections corresponding to the cavity parts of the recesses composed of the bottoms, openings and opening circumferential edges of the ceramic packages (tapered somewhat frustoconical shapes having openings formed by press) arranged in a plane. The corner parts of the mold were chamfered in the ordinary range called "R" or "C". Further, the mold was formed around it with pins for guide holes, dummy holes, etc. as common art. This cavity mold was mounted and fixed to a press machine.

The shaping mold was used to shape the recesses. At that time, the plastic ceramic green sheet cleanly followed the mold projections, and therefore, the cavity (see FIG. 1(a) and (b)) composed of the bottoms 4, openings 2 and opening circumferential edges 3 were accurately reproduced. Even after pressing, the shapes were maintained. Further, the conductor film followed deformation of the plastic ceramic green sheet. The conductor patterns elongated, without breaking and matched the cavity patterns so as to form the electrode use conductor layer 9 (see FIGS. 1(a) and (b). (7) Calcining The support film at the back surface of the ceramic green sheet 1 formed, as shown in FIG. 2, with the cavity recesses (openings 2), conductor layer 9, etc. is peeled off, it is placed on a mullite setter sprinkled in advance with spherical alumina (25 μm diameter), as powder, to prevent melt bonding. This is set in a sintering furnace of an air atmosphere and held at the peak temperature of 850° C. for 20 minutes for sintering to thereby produce a ceramic green sheet 1 (see FIG. 2) having a plurality of ceramic package units 8 arranged on it. The sintered ceramic package sheet 1 was formed with the convex projecting shapes of the mold faithfully as recesses to form the bottoms 4 and openings 2 (cavities). No bump (or upheaval) was observed at the opening circumferential edges 3 by pressing. In FIG. 2, 5 indicates a break groove, 6 a dummy part, and 7 a guide hole.

The Ag electrode parts of the ceramic packages with the electrodes attached were electroplated (electrolytic nickel plating 5 μm+electrolytic gold plating 0.3 μm), then the large number of ceramic package sheets 1 obtained were diced individually using a dicer based on the target marks formed at the time of printing so as to produce the ceramic package units 8. Note that, if necessary, it is also possible to mount the components, seal them, then dice.

The ceramic green sheets using the specific binder produced in the above way are pliable, and therefore, easy to handle at the time of work. Also, due to the unprecedented plasticity, it was possible to faithfully transfer the convex projecting shapes by the mold. The conductor layer 9 formed by printing by the conductive paste using the specific binder had good followability, a good balance of cohesiveness, and was formed without breakage by the metal press. The fabricated ceramic package units 8 thus obtained not only can be used as storage containers for electronic components or made surface mounting component devices storing electronic components, but can also be used as covers for storage containers.

Example 2

Figure 3:
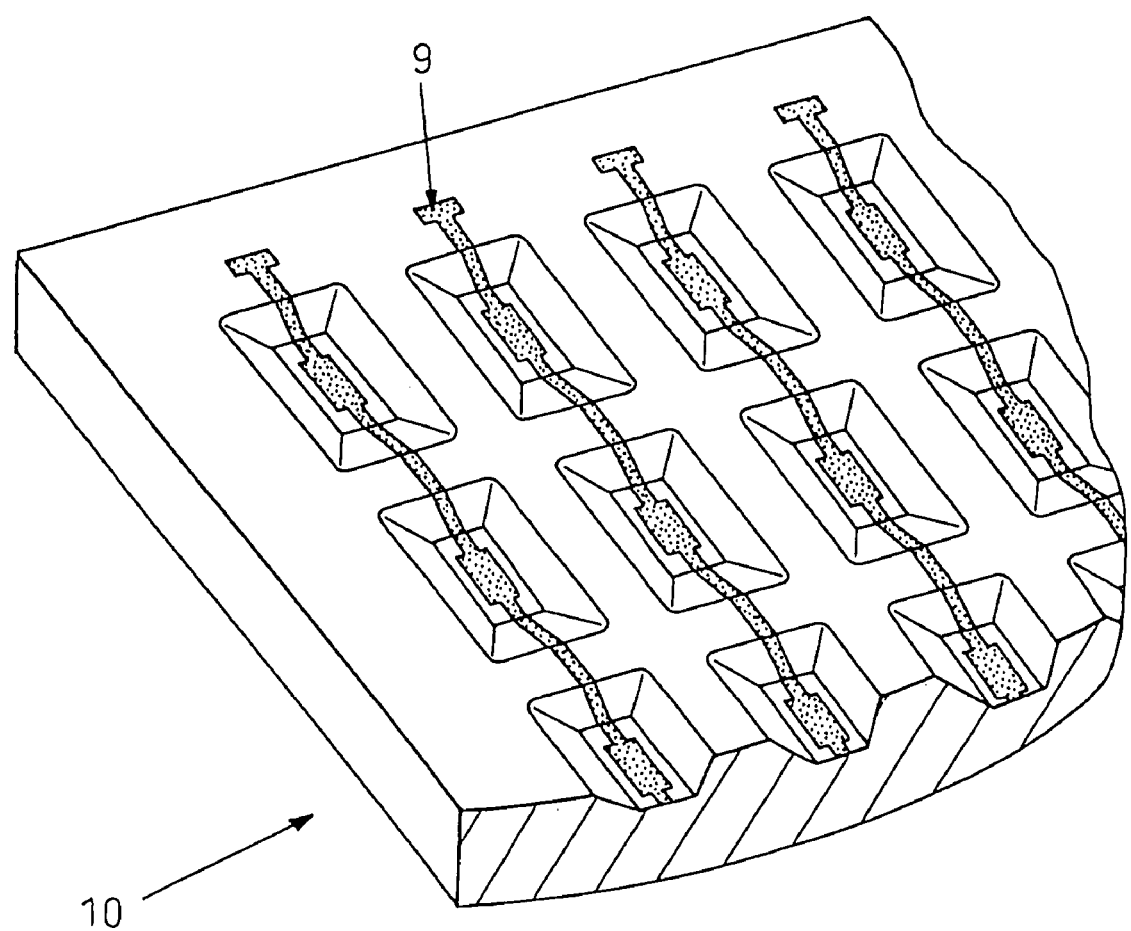
FIG. 3 is a perspective view of a ceramic cell sheet according to an embodiment of the production method according to the present invention (i.e., ceramic cell unit: ceramic package in broad sense such as plasma display panel having a plurality of regularly arranged recesses).

The same procedure was followed as in Example 1 to produce a ceramic green sheet, form a conductor layer 9, form a plurality of recesses by press forming in a regular order, without forming break grooves 5, as in FIG. 2, and calcine the ceramic green sheet to produce a ceramic cell sheet 10 composed of a plurality of ceramic cell units (i.e., ceramic package in broad sense such as plasma display panel having plurality of recesses arranged in regular order) (see FIG. 3).

Example 3

Except for making the acrylic binder used in Example 1, 20 parts by weight of a lauryl methacrylate/isobutyl methacrylate/2-hydroxyethyl methacrylate copolymer (weight ratio 60/37/3, Tg=−15° C., MW 350,000), the same procedure was followed as in Example 1 to produce a green sheet slurry. The slurry thus obtained was coated by a comma roll coater in the same way as in Example 1 to obtain a 700 μm ceramic green sheet. The ceramic green sheet thus obtained was pressed in a mold and the shape observed. Compared with Example 1, the transfer of the projecting shapes of the mold was somewhat inferior, but this was out of a level posing a problem in function.

Comparative Example 1

Except for using 5 parts by weight of the acrylic binder in Example 1, the same procedure was followed as in Example 1 to produce a green sheet slurry. The obtained slurry was coated by a comma roll coater in the same way as in Example 1 and then dried by hot air, whereupon the sheet surface showed drying cracks.

Comparative Example 2

Except for using 20 parts by weight of methyl methacrylate/ethyl acrylate/2-hydroxyethyl methacrylate copolymer (weight ratio 61/38/1, Tg=40° C., MW 400,000), as the acrylic binder in Example 1, the same procedure was followed as in Example 1 to produce a green sheet slurry. The slurry thus obtained was coated in the same way as Example 1 by a comma roll coater to obtain a 700 μm green sheet. The green sheet thus obtained was pressed by a mold, but the projecting shapes of the mold could not be sufficiently buried and a desired sheet having the recessed shapes of the mold could not be obtained.

Comparative Example 3

Except for changing the amount of the acrylic binder used in Example 1 to 40 parts by weight and for using as the plasticizer, 8 parts by weight of di(2-ethylhexyl)phthalate and 2 parts by weight of butylbenzyl phthalate, the same procedure was followed as in Example 1 to prepare a slurry and prepare a 700 μm green sheet by a comma roller coater. The green sheet thus obtained had a good pressability by a mold. However, there were remarkable dimensional changes at the time of calcining, warping was observed in the substrate, the shrinkage balance with the Ag conductor was poor and partial conductor breakage was seen.

Example 4

(1) Production of Plastic Ceramic Green Sheet Slurry

As the ceramic powder, 100 parts by weight of alumina filler-containing borosilicate glass (made by Nihon Yamamura Glass: BS-003; alumina to borosilicate glass (weight ratio)=50:50), 20 parts by weight of an ethyl acrylate/methyl methacrylate/2-hydroxyethyl methacrylate copolymer (weight ratio: 85/12/3, Tg=−15° C., weight average molecular weight (MW) converted to polystyrene 500,000) as an acryl binder, 4 parts by weight of di(2-ethylhexyl) phthalate and 1 part by weight of a butylbenzyl phthalate as plasticizers, and 55 parts by weight of a solvent (toluene/methylisobutylketone/n-butanol=1/1/1 (weight ratio)) were mixed by a dispersion mixer so as to obtain a ceramic green sheet slurry having a viscosity of 18,000 cps.

(2) Production of Plastic Ceramic Green Sheet

The above ceramic green sheet slurry was coated on a support film (weight 400 mm, length 100 m, thickness 100 μm) comprised of polyethylene terephthalate (PET) treated for mold release using a comma roll coater. The formed coating was dried at 60 to 80° C. for 1 hour to remove the solvent. Due to this, a plastic green sheet having a thickness of 250 μm was produced.

(3) Preparation of Plastic Conductive Paste

As the conductive powder, 100 parts by weight of Ag powder (made by Daiken Chemical, S-202; average particle size 3.1 μm), 15 parts by weight of a butyl acrylate/2-hydroxyethyl methacrylate copolymer (weight ratio: 100/3) as a binder resin and 30 parts by weight of a dilution solvent (ethylene glycol monoethyl ether/α-terpineol=1/1 (weight ratio)) were kneaded in a dispersion mixer to obtain an acryl conductive paste master. The commercially available conductor paste (made by Kyoto Elex K. K.: DD-1411A-508) was added with the above acryl conductive paste master to obtain a weight ratio of 1:1 and the result was mixed by a triple roll to obtain a plastic conductive paste.

(4) Shaping and Hole Punching in Plastic Ceramic Green Sheet

The plastic green sheet was cut to 18 cm×16 cm for each support film by a cutter and adhered to a hole-punching stainless steel sheet frame by tape. The frame was set in a hole punching machine and punched with printing positioning holes, printing fastening reference holes, and press reference pin holes.

(5) Printing of Plastic Conductive Paste

The plastic ceramic green sheet shaped and punched in the above (4) was fixed to the stage of the screen printing machine by the reference holes, the plastic conductive paste prepared in the above (3) was positioned, then the sheet was printed on at the prescribed positions. Next, the sheet was dried at 80° C. for 5 minutes so as to remove the solvent in the paste and form a plastic conductor layer of a thickness of 15 μm on the plastic ceramic green sheet.

(6) Printing of Resistance Member Paste

The plastic green sheets formed having the plastic conductor layer at the above (5) was fixed to the stage of a screen printing machine by the reference holes. A commercially available resistance member paste (R-U made by Sumitomo Metal Mining) was positioned, then the screen was printed at the prescribed positions. Next, this was dried at 80° C. for 15 minutes to remove the solvent in the paste and a resistor layer having a thickness of 25 μm was formed on the plastic ceramic green sheet in a manner to bridge the plastic conductor layer.

(7) Printing of Overcoat Glass Paste

The plastic ceramic green sheet formed having the resistance member layer at the above (6) was fixed to the stage of a screen printing machine by the reference holes. A commercially available glass paste (AP5576 made by Asahi Glass) was positioned, the sheet was then printed at the prescribed positions. Next, this was dried at 80° C. for 5 minutes to remove the solvent in the paste and a protection layer of a thickness of 5 μm was formed on the plastic ceramic green sheet in a manner to cover the resistance layer.

(8) Pressing by Mold

The shaping mold was composed of a superhard material. The mold was formed having a plurality of convex projections corresponding to recesses composed of the bottoms, openings and opening circumferential edges of the chip resistors (tapered somewhat frustoconical shapes with recesses formed by press) arranged in a plane. The corner parts of the mold were chamfered in the ordinary range called "R" or "C". Further, the mold was formed around it with pins for guide holes, dummy holes, etc. as common art. This cavity mold was mounted and fixed to a press machine.

The shaping mold was used to shape the recesses. At that time, the plastic ceramic green sheet cleanly followed the mold projections, and therefore the cavity patterns (see FIG. 4) were accurately reproduced. Even after pressing, the shapes were maintained. Further, the conductor film followed deformation of the plastic ceramic green sheet. The conductor patterns elongated without breaking and matched the cavity patterns so as to form the bottom electrode use conductor layer 12 (see FIG. 4). Further, the resistance layer and the protection layer were pressed against the cavity bottom, but did not deform.

(9) Calcining

Figure 7:
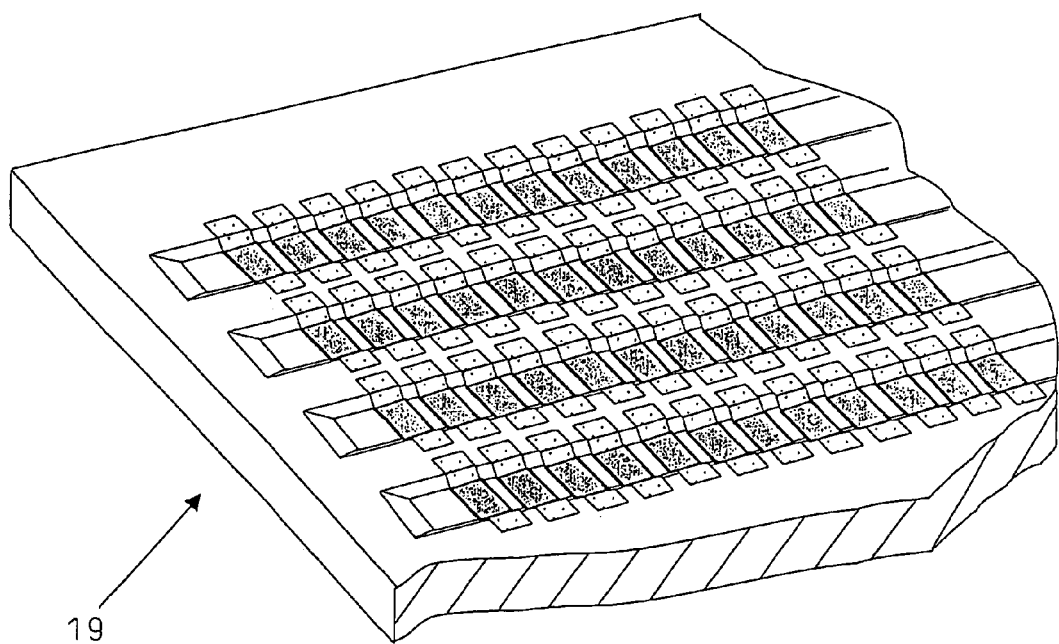
FIG. 7 is a perspective view of a chip resistor ceramic sheet according to an embodiment of the production method according to the present invention.

To prevent peeling and melt bonding of the support film at the back surface of the ceramic green sheet formed with the recesses, conductor layer 9, etc., it was placed on a mullite setter sprinkled in advance with spherical alumina (25 μm diameter) as powder. This was set in a sintering furnace of an air atmosphere and held at the peak temperature of 850° C. for 20 minutes for sintering to thereby produce a chip resistor ceramic sheet 19 (see FIG. 7) having a plurality of chip resistors arranged thereon.

(10) Laser Trimming

The chip resistor ceramic sheet produced at the above (9) was laser-trimmed by a laser trimmer (Teradyne W419) to make the resistance a predetermined value.

(11) Electroplating

The exposed Ag electrode parts of the chip resistor ceramic sheet finished being laser trimmed at the above (10) were electroplated (electrolytic nickel plating 5 μm+electrolytic gold plating 0.3 μm) to form the top conductors (bumps), then the large number chip resistor ceramic yielding chip resistor ceramic sheet was diced into using a dicer based on the target marks formed at the time of printing so as to produce the individual chip resistors.

The chip resistor according to the present invention, having bottom electrodes 12 arranged at the left and right on an insulating substrate 11 having a recess at the surface thereof, having a resistor arranged in the recess, having a protective film 15 covering the resistor 14, and having top electrodes 13 formed on the bottom electrodes 12 is thin and superior in flatness and is simplified in production process. Further, the electrical properties are also improved.

INDUSTRIAL APPLICABILITY

As explained above, the ceramic package and chip resistor according to the present invention can be obtained by forming a conductor layer on a ceramic green sheet, press forming the ceramic green sheet formed with the conductor layer to form a bottom, opening, opening circumferential edge and conductor layer and calcining the ceramic green sheet. This production process enables handling in the sheet state having plasticity and enables a conductor layer to be formed on the sheet and press forming and calcining in the sheet state, and therefore it is possible to inexpensively produce ceramic packages and chip resistors (ceramic cell sheets) having a good mass producibility and work efficiency.

The invention claimed is:

1. A ceramic package having a bottom, an opening, and an opening circumferential edge formed by integral molding, wherein the ceramic package obtained by forming, on a plastic ceramic green sheet comprising (A) 100 parts by weight of a ceramic powder mainly composed of borosilicate glass, into which (B) 10 to 30 parts by weight of an acrylic copolymer obtained by polymerizing 100 parts by weight of at least one monomer selected from (meth)acrylic acid esters and 1 to 10 parts by weight of a monomer having a functional group of a hydroxyl group, acid amide group, or amino group and having a Tg in the range of more than −30° C. to not more than +10° C. is compounded, a conductor layer using a plastic conductive paste obtained by compounding, into 100 parts by weight of a conductive powder, 5 to 20 parts by weight of (C) a mixture of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg of not more than −30° C. and an ethylcellulose-based binder, press forming the resultant single layer of the ceramic green sheet having the conductor layer formed above to provide the bottom, opening and opening circumferential edge, and calcining the integrally press formed ceramic green sheet.

2. A ceramic package as claimed in claim 1, wherein said acrylic copolymer (B) of said ceramic green sheet is a copolymer composed of ethyl acrylate or ethyl acrylate and methyl methacrylate and a monomer having a functional group of a hydroxyl group, acid amide group or amino group.

3. A ceramic package as claimed in claim 1, wherein the acrylic copolymer of said plastic conductive paste (C) is a copolymer of n-butyl acrylate and 2-hydroxyethyl methacrylate and a ratio of the mixture by weight of the acrylic copolymer/ethylcellulose-based binder is 70/30 to 30/70.

4. A method for producing of a ceramic package having a bottom, an opening and an opening circumferential edge formed by integral molding, comprising the steps of:

forming, on a plastic ceramic green sheet comprising (A) 100 parts by weight of a ceramic powder mainly composed of borosilicate glass, into which (B) 10 to 30 parts by weight of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg in the range of more than −30° C. to not more than +10° C. is compounded, a conductor layer using a plastic conductive paste (C) obtained by compounding, into 100 parts by weight of a conductive powder, 5 to 20 parts by weight of (C) a mixture of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg of not more than −30° C. and an ethylcellulose-based binder;

press forming the resultant single layer of the ceramic green sheet having the conductor layer formed above to provide a bottom, opening and opening circumferential edge; and calcining the press formed ceramic green sheet.

5. A method for producing a ceramic package as claimed in claim 4, wherein the press-formed single layer of ceramic green sheet is calcined at 750° C. to 950° C.

6. A chip resistor as claimed in claim 5, further having external electrodes formed only at the top and being flipped for mounting.

7. A chip resistor as claimed in claim 5, wherein the resistor is inserted into a recess to provide a thinness and flatness free from projections at the surface.

8. A chip resistor obtained by calcining a ceramic green sheet having a bottom, an opening and an opening circumferential edge formed by integral molding, by forming on a plastic ceramic green sheet comprising (A) 100 parts by weight of a ceramic powder mainly composed of borosilicate glass, into which (B) 10 to 30 parts by weight of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg in the range of more than −30° C. to not more than +10° C. is compounded, a conductor layer using a plastic conductive paste obtained by compounding, into 100 parts by weight of a conductive powder, 5 to 20 parts by weight of (C) a mixture of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg of not more than −30° C. and an ethylcellulose-based binder, further forming, on the resultant single layer of the ceramic green sheet formed having the conductor layer thus obtained, a resistor and protector, followed by press forming to form a bottom, opening and opening circumferential edge, and calcining the integrally press formed ceramic green sheet.

9. A method for producing a chip resistor obtained from a ceramic green sheet having a bottom, an opening and an opening circumferential edge formed by integral molding, comprising the steps of:

forming on a plastic ceramic green sheet comprising (A) 100 parts by weight of a ceramic powder mainly composed of borosilicate glass, into which (B) 10 to 30 parts by weight of an acrylic copolymer obtained by polymerizing 100 parts by weight of at least one monomer selected from (meth)acrylic acid esters and 1 to 10 parts by weight of a monomer having a functional group of a hydroxyl group, acid amide group or amino group and having a Tg in the range of more than −30° C. to not more than +10° C. is compounded, a conductor layer using a plastic conductive paste obtained by compounding, into 100 parts by weight of a conductive powder, 5 to 20 parts by weight of (C) a mixture of an acrylic copolymer obtained by polymerizing 100 parts by weight of at least one monomer selected from (meth)acrylic acid esters, 1 to 10 parts by weight of a monomer having a functional group of a hydroxyl group, acid amide group or amino group and having a Tg of not more than −30° C. and an ethylcellulose-based binder;

forming, on the resultant single layer of ceramic green sheet formed having the conductor layer a resistor and protector, followed by press forming to form a bottom, opening and opening circumferential edges; and calcining the integrally press formed ceramic green sheet.

10. A method for producing a chip resistor as claimed in claim 9 further comprising forming external electrodes only at the top and flipping the chip for mounting.

11. A method for producing a chip resistor as claimed in claim 9, wherein the resistor is inserted into a recess to provide a thinness and flatness free from projections at the surface.

* * * * *